United States Patent
Hamilton et al.

(10) Patent No.: US 7,296,430 B2
(45) Date of Patent: Nov. 20, 2007

(54) COOLING AIR FLOW CONTROL VALVE FOR BURN-IN SYSTEM

(75) Inventors: Harold E. Hamilton, Coon Rapids, MN (US); Chad M. Conroy, Stillwater, MN (US)

(73) Assignee: Micro Control Company, Fridley, MN (US)

( * ) Notice: Subject to any disclaimer, the term of this patent is extended or adjusted under 35 U.S.C. 154(b) by 303 days.

(21) Appl. No.: 10/714,116

(22) Filed: Nov. 14, 2003

(65) Prior Publication Data

US 2005/0103034 A1    May 19, 2005

(51) Int. Cl.
*F25D 23/12*    (2006.01)
*H05K 7/20*    (2006.01)
*F28D 15/00*    (2006.01)

(52) U.S. Cl. ............... 62/259.2; 236/36; 361/695; 361/688; 361/689; 361/690; 165/104.33; 165/80.3

(58) Field of Classification Search ............ 236/38, 236/35, 35.2, 35.3, 49.1, 49.3; 165/80.2, 165/80.3, 104.33; 251/304, 309; 62/186, 62/418, 259.2; 361/695, 688, 689, 690, 691, 361/694
See application file for complete search history.

(56) References Cited

U.S. PATENT DOCUMENTS

| | | | |
|---|---|---|---|
| 4,145,620 A | 3/1979 | Dice | 307/149 |
| 4,682,268 A | 7/1987 | Okano et al. | 361/384 |
| 4,851,965 A | 7/1989 | Gabuzda et al. | 361/383 |
| 4,897,762 A | 1/1990 | Daikoku et al. | 361/382 |
| 4,912,600 A | 3/1990 | Jaeger et al. | 361/385 |
| 4,935,864 A | 6/1990 | Schmidt et al. | 363/141 |
| 5,006,796 A | 4/1991 | Burton et al. | 324/158 F |
| 5,103,168 A | 4/1992 | Fuoco | 324/158 |
| 5,270,572 A | 12/1993 | Nakajima et al. | 257/714 |
| 5,277,594 A | 1/1994 | Matsuoka et al. | 439/172 |
| 5,359,285 A * | 10/1994 | Hashinaga et al. | 324/158.1 |
| 5,361,188 A | 11/1994 | Kondou et al. | 361/695 |
| 5,428,503 A | 6/1995 | Matsushima et al. | 361/695 |
| 5,515,910 A | 5/1996 | Hamilton et al. | 165/30 |

(Continued)

OTHER PUBLICATIONS

Burn-in Fixture for Modules, IBM Technical Disclosure Bulletin, vol. 27, No. 7B, Dec. 1984, p. 4278.

(Continued)

*Primary Examiner*—Chen Wen Jiang
(74) *Attorney, Agent, or Firm*—Westman, Champlin & Kelly, P.A.

(57) ABSTRACT

A burn-in oven is provided with a plurality of spaced, stacked burn-in-boards, each with a plurality of individual circuits being tested under heated conditions, and a plurality of valve trays positioned between two burn-in-boards to form a heat exchange compartment below the valve tray. Each valve tray has a plenum formed above it to provide a separate chamber that is a source of cooling air. Each valve tray has a plurality of valves, one over each of a number openings in the tray. Each opening overlies an integrated circuits or device under test on the burn-in-board below the valve tray. The valves control the flow of air for cooling the integrated circuits. The flow of air through the valves is the only path for cooling airflow to the integrated circuits on the burn-in-boards.

18 Claims, 7 Drawing Sheets

U.S. PATENT DOCUMENTS

| | | | |
|---|---|---|---|
| 5,544,012 A | 8/1996 | Koike | 361/695 |
| 5,579,826 A | 12/1996 | Hamilton et al. | 165/254 |
| 5,582,235 A | 12/1996 | Hamilton et al. | 165/263 |
| 5,807,104 A | 9/1998 | Ikeya et al. | 439/73 |
| 5,889,651 A | 3/1999 | Sasaki et al. | 361/699 |
| 5,911,897 A | 6/1999 | Hamilton | 219/497 |
| 5,923,179 A | 7/1999 | Taylor | 324/755 |
| 5,952,842 A | 9/1999 | Fujimoto | 324/760 |
| 5,978,218 A | 11/1999 | Fujimoto et al. | 361/696 |
| 6,043,980 A | 3/2000 | Katsui | 361/695 |
| 6,086,387 A | 7/2000 | Gallagher et al. | 439/71 |
| 6,100,706 A | 8/2000 | Hamilton et al. | 324/760 |
| 6,144,215 A | 11/2000 | Maxwell et al. | 324/765 |
| 6,175,498 B1 | 1/2001 | Conroy et al. | 361/704 |
| 6,213,806 B1 | 4/2001 | Choy | 439/331 |
| 6,698,718 B2 * | 3/2004 | Yoo | 251/309 |
| 2002/0149911 A1 | 10/2002 | Bishop et al. | 361/690 |
| 2003/0112025 A1 | 6/2003 | Hamilton et al. | 324/760 |

OTHER PUBLICATIONS

"Thermal Aspects of Burn-In for High Power Semiconductor Devices," Micro Control Company, Reprinted 2002, IEEE Proceedings from The Eight Intersociety Conf. On Thermal and Thermomechanical Phenomena in Electronic Systems, California.

* cited by examiner

COOLING AIR FLOW CONTROL VALVE FOR BURN-IN SYSTEM

BACKGROUND OF THE INVENTION

The present invention relates to apparatus for controlling temperatures of integrated circuit chips being tested on burn-in-boards in a burn-in oven or system. More particularly, the invention relates to a flow control valve that controls the flow of cooling air onto an associated heat sink for a circuit chip supported directly below the valve. The temperature of each integrated circuit chip is sensed and compared with a desired set point temperature to determine a temperature error signal and the amount of cooling air directed toward the heat sinks is varied as a function of the error signal to maintain precise temperature control.

Burn-in-ovens that are used for testing integrated circuits are well known. The prior art ovens have used various types of cooling devices for controlling the temperatures of the burn-in-boards within a selected range. Individual fans for providing cooling air directly on heat sinks, are shown in co-pending U.S. application Ser. No. 10/020,348, filed Dec. 12, 2001. The fans work well but do not provide the cooling capability of the present invention. A more passive way of controlling the heat has been to provide a flow of air from plenum chambers at the ends of an oven across a number of the chips supported on burn-in-boards and then exhausting the air out through exhaust panels.

The power required for testing has increased with the advent of circuits that consume more power in use. The ability to provide an adequate amount of cooling to each individual high power circuit under test to regulate the cooling and thus the temperature of each chip within acceptable limits has become more difficult.

The need for an easily controlled, highly responsive cooling airflow control continues to exist.

SUMMARY OF THE INVENTION

The present invention relates to a cooling airflow control system for a burn-in-board oven or enclosure that uses individual valves for controlling flow from a plenum chamber having a supply of cooling air onto one of the circuits, and in particular, onto a heat sink that is provided as part of a holder for the circuit chips for transferring heat away from the circuit. The valves are over openings in a tray, with each tray above a burn-in board. The heat sinks have radiating fins thereon and the cooling airflows help to dissipate the heat generated by the circuit devices under test, sometimes called DUTs.

The plenum chamber which forms an air supply for the valves is preferably, and as shown, an individual plenum chamber for each tray of valves used in the burn-in-oven. As will be shown, the valve trays are spaced so a burn-in-board with DUTs can be placed below each valve tray.

Each holder for the DUTs includes a temperature sensor that senses the temperature of the circuit chip and provides a signal to a control computer or processor. A temperature sensor may also be embedded in the DUT for the same purpose. The processor compares the sensed temperature with a desired set point temperature to develop an error signal if there is the need for more or less cooling air. This error signal is used for controlling the valves of the present invention as desired.

In the present invention, the temperature differential signal, or error signal, is used for controlling the opening of individual valves that are positioned on a valve tray spaced from and above the individual circuits supported on a burn-in-board. The valve tray is a solid wall tray or plate spanning the burn-in oven and supported on rails in the oven, and has openings through which a valve controls air flow.

A cooling air plenum chamber is formed above each of the valve trays a shown, and preferably by using a solid wall panel overlying the respective valve tray supported on three sides of the tray to form plenum chambers with one side forming an inlet slot. There is a cooling air inlet opening at one end of the oven for each cooling air plenum chamber that is open to the inlet slot when the valve tray assembly is installed. The exit or exhaust passage for air from the cooling air chamber is through the valves and corresponding openings in the tray to a heat sink chamber formed below the valve trays and above the respective underlying burn-in-board. The heat sinks are each in contact with a DUT to conduct heat away from the DUT.

The valve trays and burn-in-boards in the oven are alternated and stacked with spaces between the trays and boards so that the cooling air space or chamber above the valve tray may also be formed by another overlying burn-in-board. With any desired cooling air chamber above a valve tray, when a valve is opened, cooling air flows into the heat sink or heat exchange chamber between the valve tray and underlying burn-in-board and directly onto the heat sink below that valve. When all of the valves on a valve tray are closed, no cooling air flows onto the heat sinks for DUTS on the burn-in-board below the valve tray.

In use, the burn-in-oven will always have a full complement of valve tray assemblies, and may not have burn-in-boards under each valve tray assembly. If no burn-in-board is below a valve tray, the valves in such tray are left closed.

As shown, a conventional cooling air system is adapted to the desired oven configuration. An exhaust chamber receives air from each of the exhaust passageways for air from the heat sink chamber above the burn-in-boards after the air has been passed over the heat sinks for the individual circuits. The air exhausted from the heat sink chambers circulates through an air cooler and then is forced back to the air supply by a blower or fan.

The valves are individually controlled and provide for better modulation of flow. Since barrel valves can adjust the flow through valve openings more precisely than other types of valves in use, such as butterfly valves, barrel valves are preferred, but other controllable valves will work.

DETAILED DESCRIPTION OF THE PREFERRED EMBODIMENTS

A typical burn-in oven 10, shown schematically, is provided with a frame 12 that has four corner posts 13, held together as desired and supporting a series of rails or guides 14 for holding burn-in-board trays, and guides 16 for holding valve trays or boards made according to the present invention. The burn-in-board trays (also just called burn-in-boards) shown generally at 20 will slide in on the rails 14, and completely fill the area between the side guides and the walls defined by the frame 12, so that the burn-in-boards block airflow vertically in the oven enclosure. Insulated side walls and a door enclose the oven or other enclosure for testing.

Figure 3:
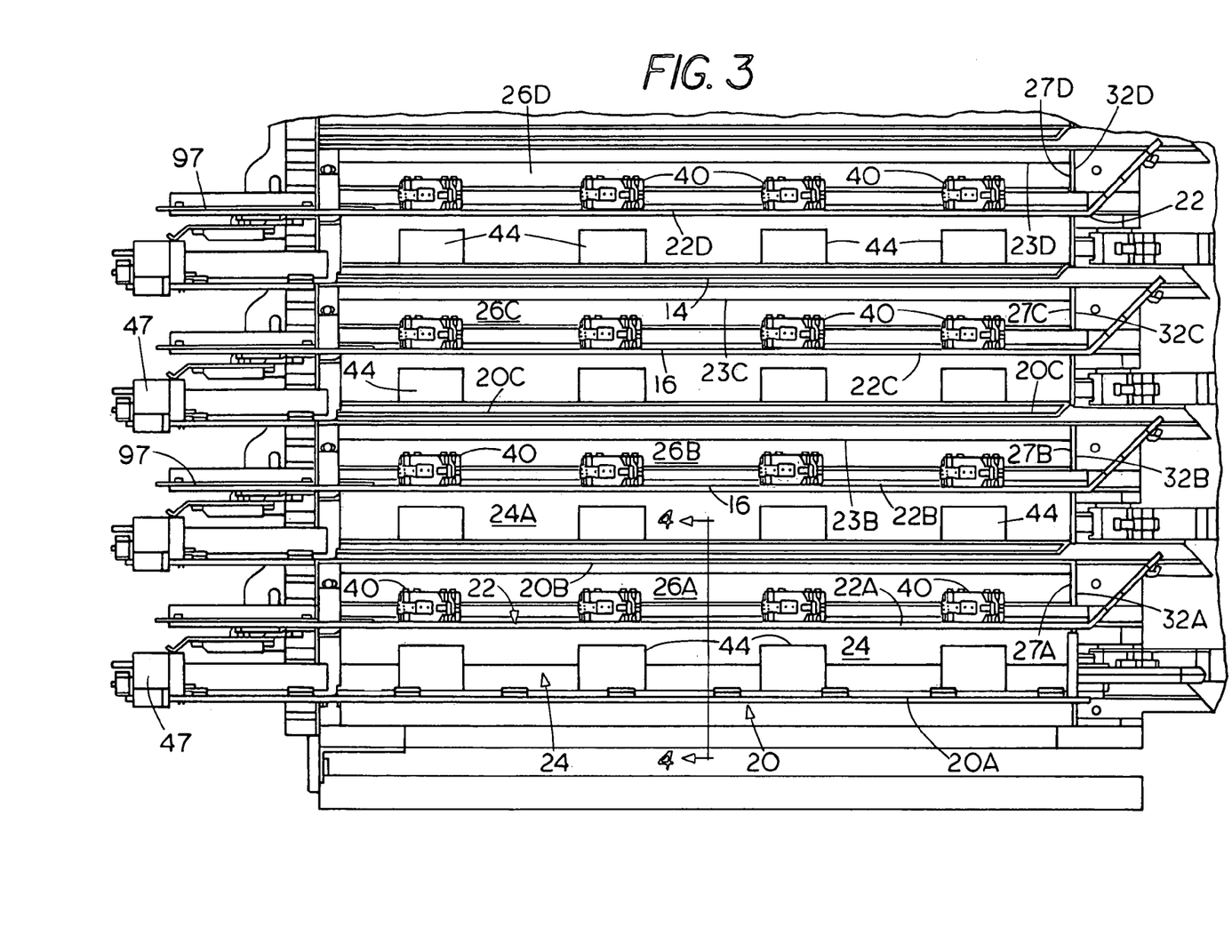
FIG. 3 is an enlarged sectional view taken on line 3—3 in FIG. 1.

Individual air flow control valve tray assemblies made according to the present invention includes trays or boards shown generally at 22 and specifically numbered 22A, 22B, 22C, and 22D in FIG. 3, and these would be 22N valve tray assemblies in a burn-in oven. The valve trays slide into the rails 16 and likewise will completely block the open horizontal area in the frame 12. As perhaps best seen in FIGS. 3, 4, and 5, each valve tray 22A–22D has an overlying solid wall 23A–23D spaced therefrom to form a cooling air plenum chamber 26A–26D, up to 26N plenum chambers. Each wall 23A–23D is supported on solid edge walls 25 on three sides of the respective tray leaving one side of the cooling air plenum chamber open with an inlet slot 27.

The cooling air plenum chambers 26A–26N of respective valve trays 22A–22N are above the valve trays and each valve tray 22A–22N is above an associated burn-in-board.

The space between the lower side of a valve tray and the underlying burn-in-board forms a heat sink chamber or heat exchange chamber. A first heat sink chamber 24 is formed above burn-in-board tray 20. A further valve tray 22B is positioned above the burn-in-board 20B, to form a heat sink chamber 24A above the burn-in-board 28B, and each subsequent burn-in-board 20 has an overlying valve tray 22 for a total 20N burn-in-boards, and 22N valve trays that form heat sink or heat chambers 24N stacked vertically.

The valve tray assembly a second cooling air plenum chamber 26B above the valve tray 22B is formed by walls 23 and 25. The stacked valve trays and overlying burn-in-boards form "26N" cooling air plenum chambers.

The cooling air is provided by a suitable fan or blower 28 that is coupled to a main cool air supply chamber shown schematically at 30 on one side of the oven 10. The cool air supply chamber 30 is open to the end inlet slots 27A–27D (up to 27N) of each of the cooling air chambers 26A–26N that are formed above the stacked burn-in-boards 22N. Only a few burn-in-boards and valve trays are shown for sake of simplicity in illustration, but they can be stacked vertically in as many of the slides or rails 14 and 16, as desired. Again, all of the positions for valve tray assemblies in the oven are filled, but if desired, only a selected number of burn-in-board trays are in the oven.

Figure 1:
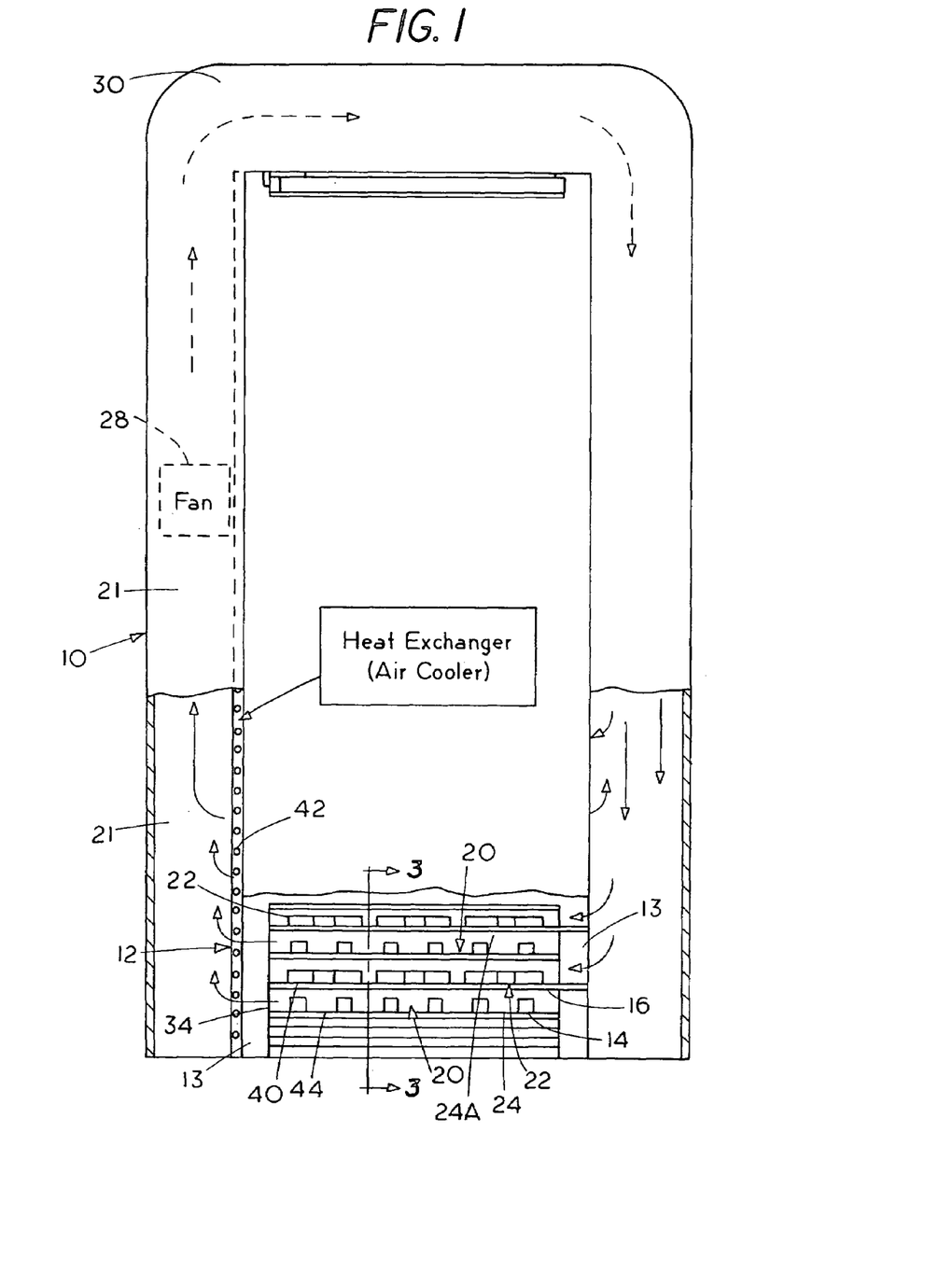
FIG. 1 is a schematic side view of a burn-in oven showing a plurality of valve tray assemblies and burn-in-boards stacked vertically.
Figure 2:
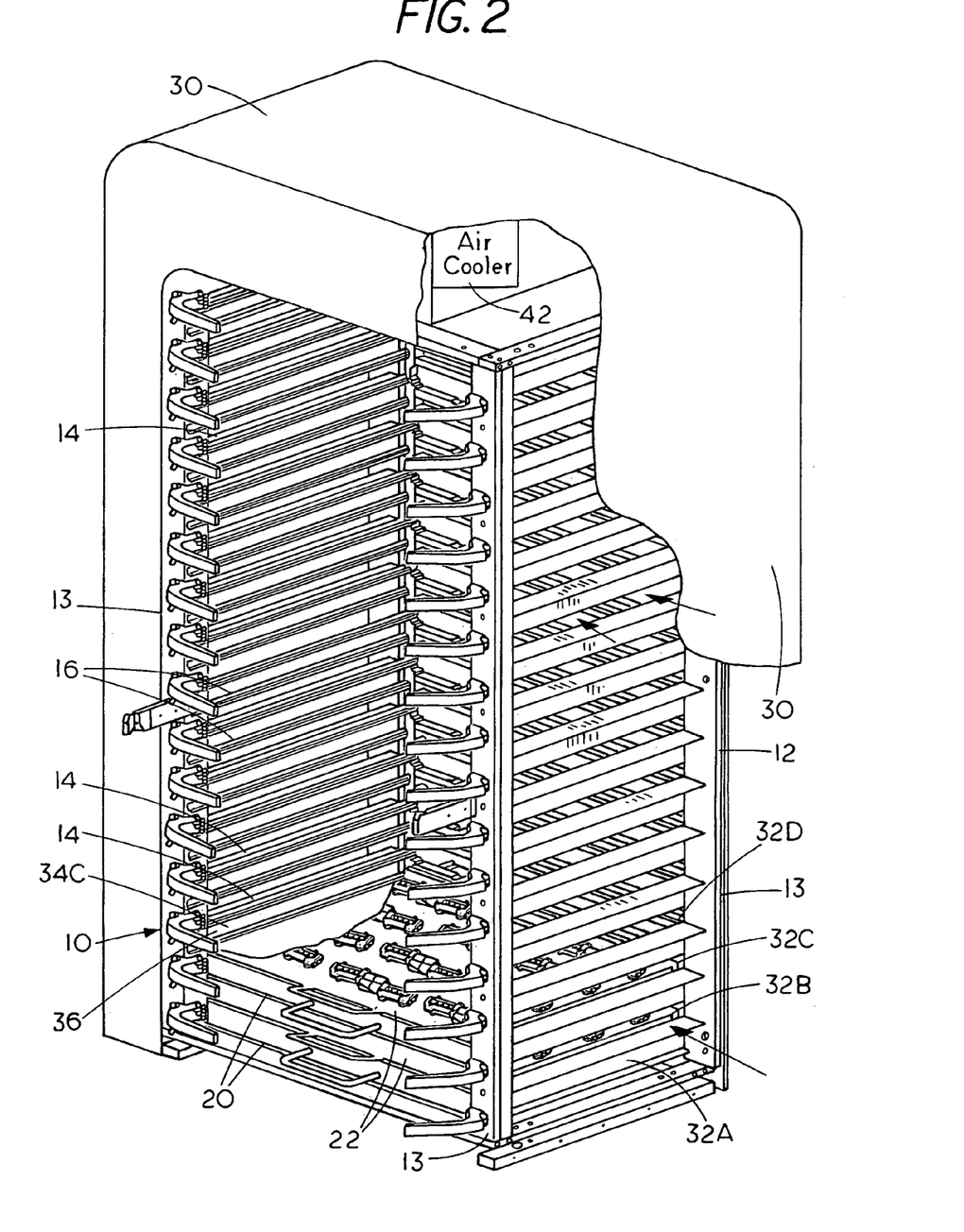
FIG. 2 is a perspective view of the burn-in oven of FIG. 1 showing only a few burn-in-boards and valve tray assemblies in position.
Figure 4:
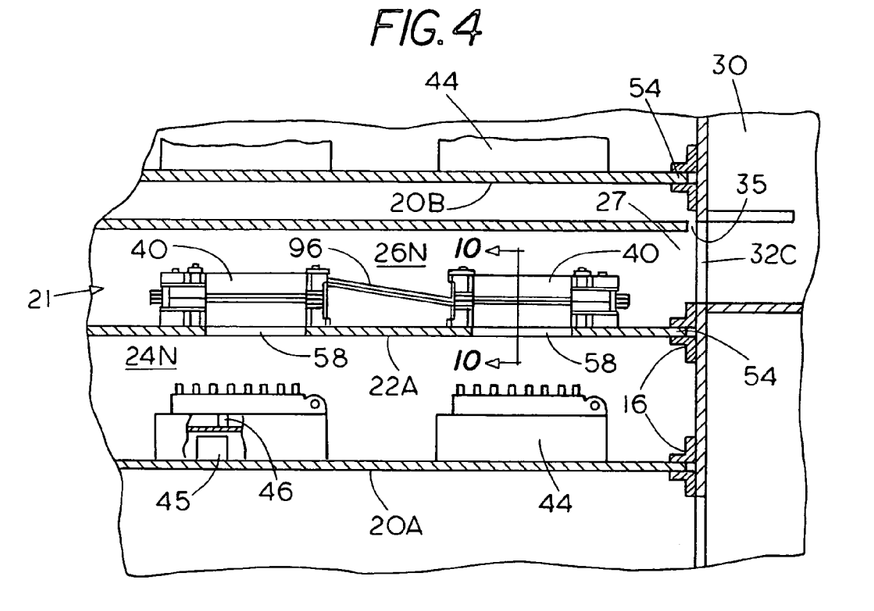
FIG. 4 is a fragmentary sectional view taken on line 4—4 in FIG. 3.

Cooling airflow is provided from the main cool air supply chamber 30 through slots or openings 32A–32D (up to 32N) through the side wall of the oven, and are shown schematically in FIG. 2, and in FIG. 4. The slots 32A–32N in the oven wall align with the cooling air plenum chamber inlet slots 27A–27D at the ends of the cooling air plenum chambers 26N formed by the valve trays 22, and walls 23 and 25. The cooling air plenum chamber of all of the valve tray assemblies are provided with cooling airflow from the main cool air supply chamber 30 through the slots 32A–32N.

On the side of the oven enclosure opposite from the main cool air supply chamber 30 for cooling air, there are exhaust discharge slots or openings 34A and 34B (FIG. 2) (up to 34N), that align with the heat sink or heat exchange chambers 24 formed above each burn-in-board and below the respective overlying valve tray. There is an exhaust slot or opening for each of the heat sink or heat exchange chambers 24 formed by the respective burn-in-boards and the overlying valve trays. Exhaust openings are only from the heat exchange chambers 24–24N and lead into an exhaust chamber 21 in which an air circulation blower or fan 28 can be mounted.

The cooling air plenum chambers 26N above each of the valve trays have the inlet slots 27N at one end, but no constantly open exhaust openings. Cooling air is exhausted from plenum chambers 26 by passing through valves 40 that control flow into the heat exchange chambers 24–24N through openings 58 in the valve tray. However, some air will bleed out along the tracks or rails for the trays, and in order to provide some cooling air along the bottom surfaces of the burn-in-boards, a gap shown at 35 in FIG. 4 permits some cooling air to enter the space above each wall 23 and below the overlying burn-in-board.

The cooling air for the main cool air supply chamber 30 is circulated by fan or blower 28 through an air cooler 42 in the flow path to exhaust air chamber 21, so that the air in the cool air supply 30 is cooled and is used for maintaining and reducing the temperature of the individual circuits.

Figure 5:
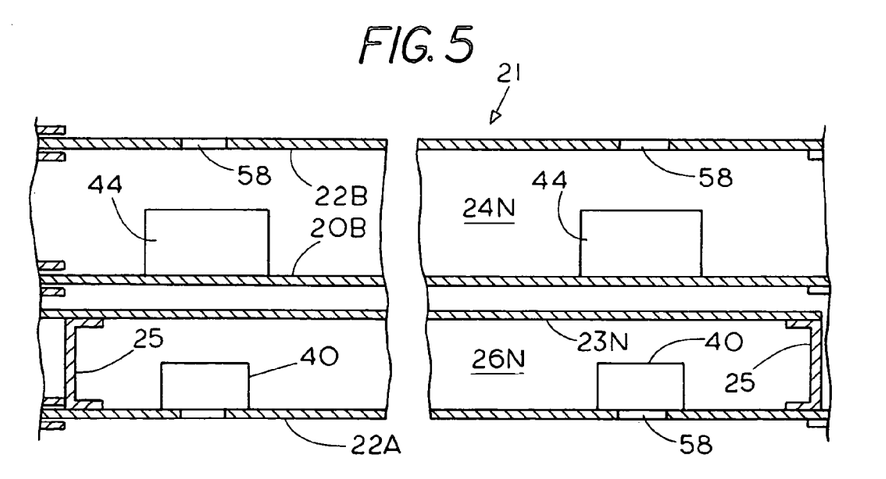
FIG. 5 is a fragmentary, schematic sectional view taken on line 5—5 in FIG. 4.

Each of the circuits or devices under test (DUT) is supported in a socket or holder 44, that comprises a finned heat exchanger or heat sink, generally formed as shown in U.S. patent application Ser. No. 10/646,889, filed Jan. 14, 2002, and incorporated by reference. Each of the holders for the DUTs has a heater 45 and temperature sensor indicated schematically at 46 in FIG. 4 and also in FIG. 11. The temperature signal from the temperature sensor 46 is fed to a controller 48 (FIG. 11), and the controller in turn is connected to the valves 40 to control the amount of opening of each valve. The burn-in-boards have connectors 47 at ends that extend out from one wall of the burn-in oven, as shown in FIGS. 3 and 5.

Figure 6:
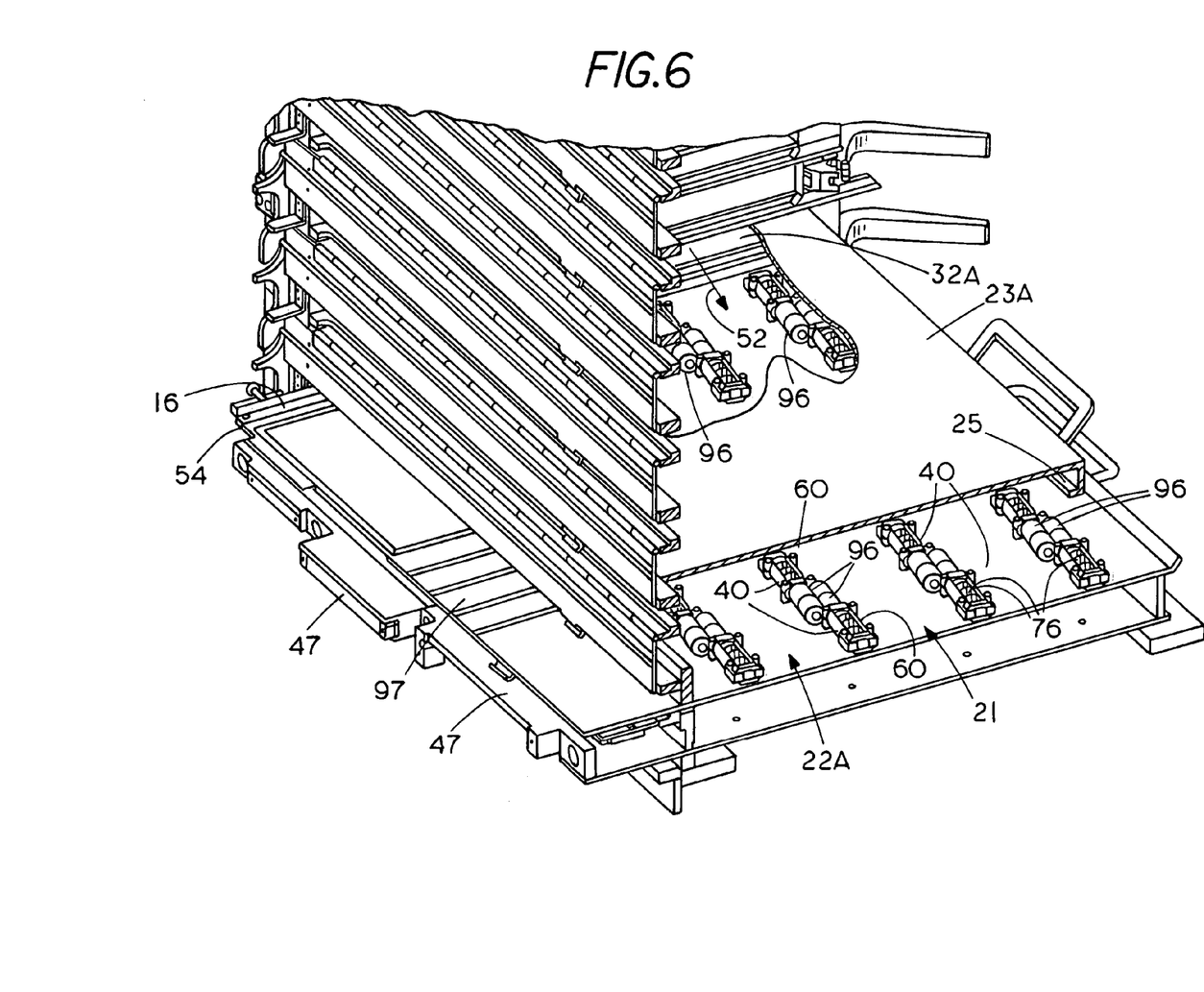
FIG. 6 is a perspective view of a valve tray positioned in a burn-in oven showing the valves in position on a valve tray.

FIG. 6 shows a typical valve tray assembly 21 and the valves 40 are shown in position on a tray 22. The valves 40 are preferably barrel valves as shown that have valve bodies 60 housing rotary valve elements 76 controlled by suitable motors 96. (See FIGS. 7–10 as well.) The motors 96 for two valves 40 are positioned side by side with the valve bodies 60 extending in opposite directions. The cooling airflow direction is indicated by the arrow 52 in FIG. 6. The valves 40 are positioned at a slight angle to the orthogonal direction of airflow through the plenum chambers 26 and across the associated valve tray 22. The valve tray 22 may have rails 54 on opposite sides thereof that are used for supporting it in the guides 16 of the burn-in oven 10.

As can be seen, the typical valve tray 22 has a plurality of individual barrel valves 40. Each of the valves 40 is mounted over an opening 58 (FIGS. 4 and 5) through the valve tray 22 so that flow controlled by the valve will be directed onto a finned heat sink or heat exchanger comprising the holder for the DUT on the burn-in-board directly below the respective valve 40.

Figure 7:
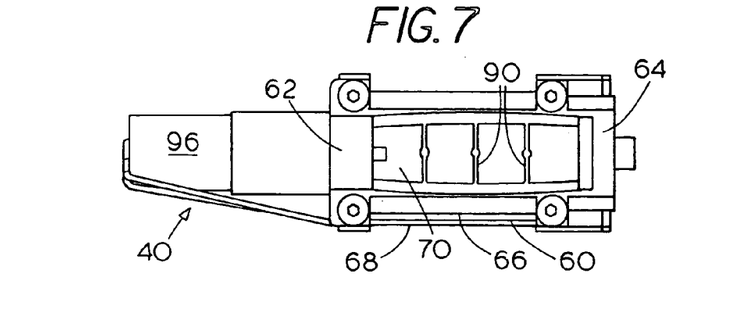
FIG. 7 is a top plan view of a barrel valve used in the present invention.
Figure 10:
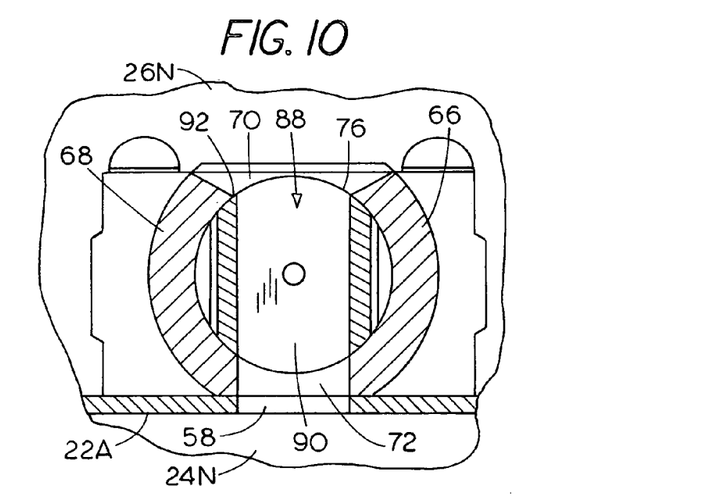
FIG. 10 is a sectional view of a typical barrel valve taken on line 10—10 in FIG. 4.

Referring to FIG. 7, a top plan view of a typical preferred valve 40 is illustrated. Also, FIGS. 8–10 are referred to for showing the different parts of the valves.

While barrel valves are preferred, and are illustrated as a best mode, other controllable valves can be used. Slide valves, rotary or pivoting cover valves, poppet valves and the like, which are capable of being opened and closed as a function of a control signal will work.

Figures 8, 9:
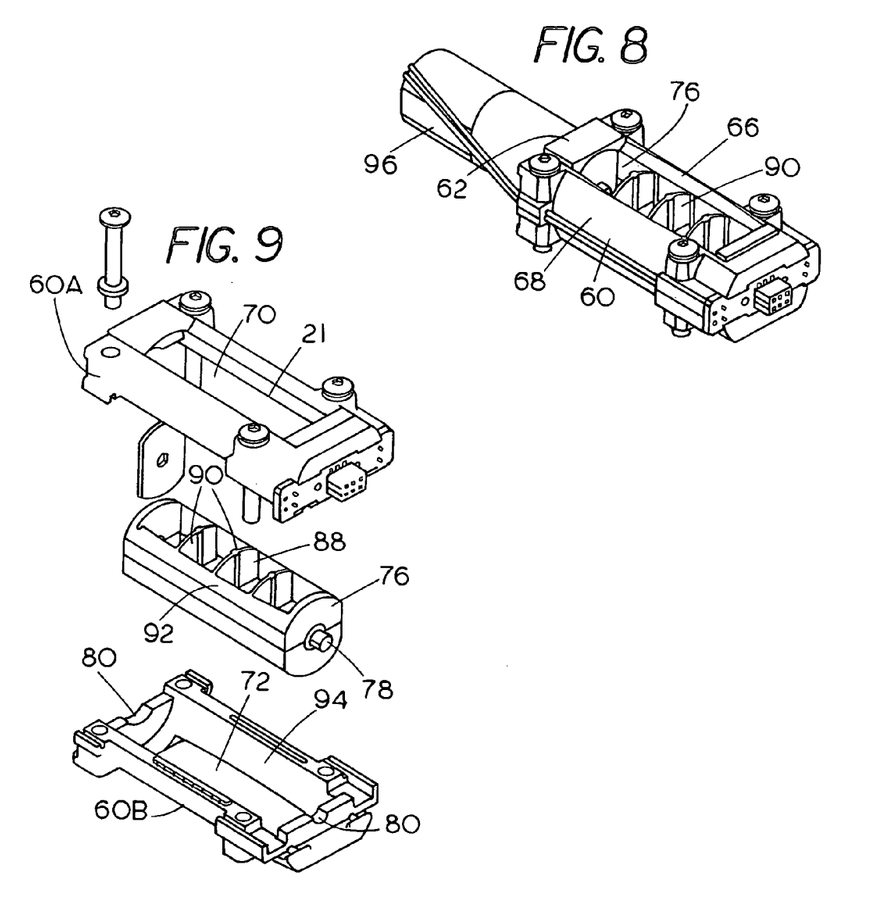
FIG. 8 is a perspective view of a barrel valve shown in FIG. 7.
FIG. 9 is an exploded view of a barrel valve as shown in FIG. 8.

Each of the preferred form of valves 40 is provided with a valve body 60 that is made in two stacked sections 60A and 60B (see FIG. 9). When the two sections are assembled, the housing has end walls 62 and 64, joined by side walls 66 and 68. The side walls 66 and 68 are spaced apart to form a top opening 70, and a bottom opening 72 as shown in FIG. 10. FIG. 10 includes a partial cross-section of the valve tray 22A. It shows that the valve tray 22A has openings 58 directly below the valve lower opening 72 so that there is an alignment for flow between the cooling air plenum chamber 26N above the respective valve tray 22A to the heat sink or heat exchange chamber 24N below the valve tray 22A.

The valve 40 has a rotary barrel valve element 76 that has mounting shafts 78 on both ends. The shafts 78 are rotatably mounted in suitable supports 80 on the end walls 62 and 64 of the valve body.

Each of the valve body sections 60A and 60B includes a portion of the end walls and the side walls formed to define the openings 72 and 70. The barrel valve element 76 is a part of a cylinder with parallel planar surfaces through which a central opening or passageway 88 is formed. The opening or passageway 88 is divided into four sections with transverse flow straightener walls 90. The opening or passageway 88 goes all the way through the part cylindrical valve element 76, as can be seen. The part cylindrical outer surface portions of the valve element 76 are along the top as indicated at 92. These part cylindrical surfaces extend between the parallel planar surfaces.

The side surfaces of the valve element opening in the valve body mate with the part cylindrical surface of the valve element 76. As can be seen in FIG. 9, the lower housing section 82 has part cylindrical surfaces 94, and the upper section has similar surfaces. The surfaces 94 seal with the outer part-cylindrical surfaces of the rotary or barrel valve element 76.

The mating part-cylindrical surfaces are such that they will continue to seal as the barrel valve element rotates 76. The valve element 76 has planar side surfaces, as can be seen. The sealing will continue as the barrel valve element 76 is rotated.

Figure 11:
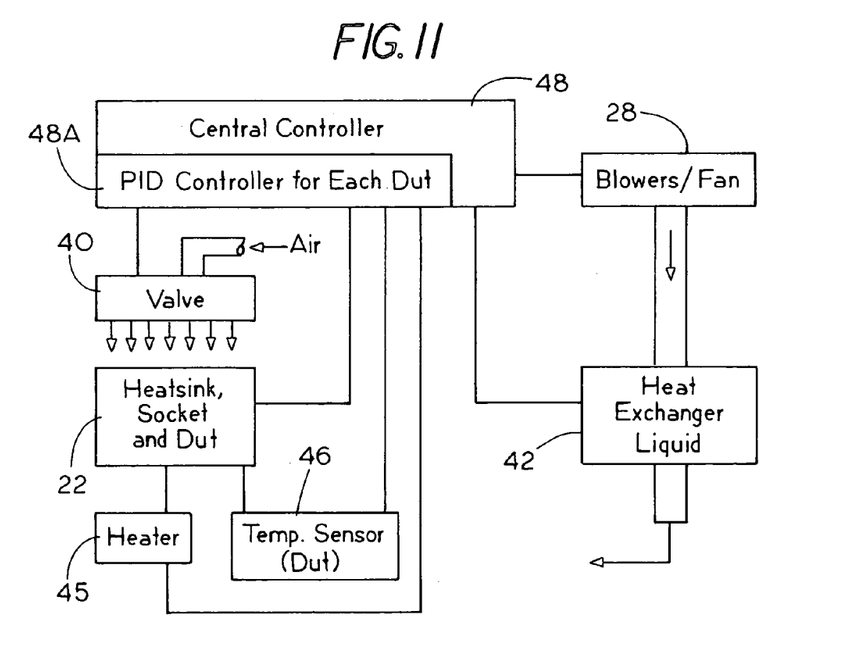
FIG. 11 is a block diagram of a control system for the valves.

The valve element 76 of each valve 40 is driven by a separate motor 96 that is connected to a suitable source of power through the controller 48 (FIG. 11). Connections to the motors 96 are made at connector ends 97 of the valve trays, as shown in FIGS. 3 and 6. The direction and amount of rotation of the output shaft 98 of each motor 96 will be determined by the controller in relation to the amount of air flow through the opening in the valve 40 onto the underlying heat sink that is called for by the sensed temperature differential signals between the sensed temperature at the DUT and the set point or reference temperature. Each valve motor can be controlled by a PID controller 48A which forms part of the main controller 48 again, as shown in FIG. 11. The valve motors can drive other types of controllable valve elements, as explained.

The direction of rotation of the valve element 76 can be reversed by the motor 96. Barrel valves can control the flow more precisely than a butterfly valve, for example, because the rotation of the barrel valve elements will proportionally open the flow path between a fully closed position and a fully open position.

It can be seen at FIGS. 8 and 9 that the associated motor 96 mounts directly onto the end of the body 60 for the barrel valve element 76, and makes a very compact package. Also it can be seen at FIG. 5 that the valves 40 are arranged in pairs, with the motors 96 overlapping, and the valve bodies then extend from the motors in opposite directions to overlie openings 58 in the valve tray 22N.

FIG. 11 is a simplified block diagram of the controller 48 and components and functions controlled. The heater 45 can be used to aid in controlling the temperature of the DUT. The controller also can control the temperature of the air heat exchanger 42 used to cool the supply air with a suitable refrigeration unit. The block 44 in FIG. 11 is used to represent the complete holder, including the heat sink and the DUT.

Use of the individual valves permits much better control of airflow for cooling relative to the heat sinks than can be achieved with other forms and very precise and high temperatures can be controlled with this arrangement.

While the preferred embodiment shown provides a separate cooling air plenum chamber formed above each valve tray, when a burn-in-board is in place above a valve tray, the overlying burn-in-board will form a cooling air plenum above the valve tray.

If all of the burn-in-board trays are installed in an oven, the separate walls forming the cooling air plenums above the valve trays can be omitted.

The valve trays or boards are relatively low cost, easily installed, and will provide for a direct, very controlled airflow path across the heat sinks on circuits being tested or burned in.

Although the present invention has been described with reference to preferred embodiments, workers skilled in the art will recognize that changes may be made in form and detail without departing from the spirit and scope of the invention.

What is claimed is:

1. A valve system for a burn-in oven having a burn-in-board including a plurality of integrated circuits being tested under heated conditions, a tray positioned above the burn-in-board to form a heat exchange chamber overlying the burn-in-board, and a plenum chamber formed above the tray for receiving cooling air, the improvement comprising a separate individual opening in the tray overlying each of the integrated circuits on the burn-in-board, and a separate, individually controlled valve on the tray controlling flow through each individual opening from the plenum chamber above the tray directed to an associated integrated circuit, the valve at each individual opening forming a path for air flow from the plenum chamber directly onto an associated integrated circuit.

2. The valve system of claim 1, wherein said valve comprises a valve having a through opening and a valving element for controlling flow through the through opening.

3. The valve system of claim 2, wherein said valve comprises a body rotatable about a longitudinal axis, and having a body opening transverse to the longitudinal axis, a housing for receiving the body, the housing having at least a part cylindrical surface sealing against a part cylindrical surface of the body, and the through opening being in the housing and aligning with the body opening in a selected rotational position of the body, and the body controlling reducing the through opening size upon rotation of the body to control flow of air through the valve.

4. The valve system of claim 2, wherein there is a separate electric motor connected to each valving element, and a controller to control a position of each valving element.

5. The valve system of claim 4 and a controller for each of the integrated circuits including a sensor for sensing a temperature of the associated integrated circuit to provide a temperature signal, the controller controlling the position of the valving element of the associated valve as a function of the temperature signal.

6. An air flow control plenum assembly for controlling air flow onto heated devices under test, a valve tray overlying the devices under test, a wall supported above the valve tray and having side walls along sides of the valve tray to form a plenum chamber enclosed except for an inlet, a plurality of outlet openings through the valve tray, one opening aligned with each device under test, a separate controllable valve attached to the valve tray for each outlet opening controlling a flow of air from a source of cooling air provided at the inlet of the plenum chamber to an opposite side of the valve tray and onto an associated device under test, whereby a flow of cooling air is selectively provided through each outlet opening by controlling the position of a valve element in an associated controllable valve.

7. The air flow control plenum of claim 6, including a controller for controlling the position of each valve element in response to a selected parameter.

8. The air flow control plenum of claim 7, wherein the controller individually adjusts each valve element position as a function of a temperature signal indicating the temperature of a device under test receiving air flow from the respective valve.

9. The air flow control plenum of claim 6, wherein the valve element in each valve is a rotary valve element, and a separate motor driving the respective rotary valve element to control the position of the rotary valve element to adjust flow through the respective outlet opening.

10. The air flow control plenum of claim 6, wherein said source of cooling air comprises a second cool air supply chamber at one end of an oven supporting the air flow control plenum.

11. The air flow control plenum of claim 6, used in combination with a series of vertically stacked air flow control plenums of claim 6 in an oven chamber, each valve tray carrying an associated plenum chamber overlying a burn-in-board having devices under test.

12. In combination, a burn-in oven, and a plurality of first and second trays in the oven, combined with a cooling air flow source, the burn-in oven defining a compartment, a plurality of first trays forming burn-in-boards having devices under test mounted thereon in a preselected array; a plurality of second trays comprising valve trays spaced from each of the burn-in-board trays on a side of each burn-in-board tray so that the valve trays overlie the devices under test and form a laterally extending space between such trays; a cooling air plenum on a side of each valve tray enclosed by a wall and spaced from the respective valve tray, each valve tray having openings overlying each underlying device under test on an associated burn-in-board; separate variable opening rotary valves each couple to one of the valve trays adjacent one of the valve tray openings and controlling flow through each valve tray opening from the cooling air plenum, a separate temperature sensor for each device under test to provide a signal indicating the temperature of each device under test, and a controller receiving the signals from the respective temperature sensors and adjusting the variable opening of the rotary valve associated with the respective device under test as a function of the associated temperature signal.

13. The combination of claim 12, wherein said devices under test comprise holders supporting an integrated circuit under test, a heat sink on each holder, said heat sink extending into the space between each burn-in-board tray and its associated overlying valve tray.

14. The combination of claim 12, wherein said burn-in oven has a blower for providing a flow of cooling air to the cooling air plenums, and a flow passageway carrying air from said blower to an inlet end of each cooling air plenum to provide cooling air to each of the cooling air plenums.

15. The combination claim 12 further including an air exhaust opening at an end of each space between a valve tray and an underlying burn-in-board tray, the exhaust opening being on an opposite side of the burn-in oven from inlet ends of the cooling air plenums.

16. The combination of claim 12, wherein the wall forming the cooling air plenum is connected to the respective valve tray and moves with the valve tray.

17. The combination of claim 16, wherein each of the walls is connected to the respective valve tray by side walls extending between the respective wall and valve tray to form a valve tray assembly.

18. The combination of claim 17, wherein the side walls are spaced at a portion of a valve tray assembly to form an air inlet.

* * * * *